United States Patent
Foo et al.

(10) Patent No.: US 11,480,999 B2
(45) Date of Patent: Oct. 25, 2022

(54) MOBILE COMMUNICATION DEVICE COVER GLASS

(71) Applicant: Google LLC, Mountain View, CA (US)

(72) Inventors: Ken Foo, San Jose, CA (US); Yi Tao, San Jose, CA (US)

(73) Assignee: Google LLC, Mountain View, CA (US)

( * ) Notice: Subject to any disclaimer, the term of this patent is extended or adjusted under 35 U.S.C. 154(b) by 157 days.

(21) Appl. No.: 16/766,092

(22) PCT Filed: Dec. 14, 2018

(86) PCT No.: PCT/US2018/065617
§ 371 (c)(1),
(2) Date: May 21, 2020

(87) PCT Pub. No.: WO2019/118811
PCT Pub. Date: Jun. 20, 2019

(65) Prior Publication Data
US 2020/0348730 A1   Nov. 5, 2020

Related U.S. Application Data

(60) Provisional application No. 62/599,532, filed on Dec. 15, 2017.

(51) Int. Cl.
*B32B 1/02* (2006.01)
*G06F 1/16* (2006.01)
(Continued)

(52) U.S. Cl.
CPC .............. *G06F 1/1637* (2013.01); *B32B 1/02* (2013.01); *B32B 7/12* (2013.01); *B32B 17/06* (2013.01);
(Continued)

(58) Field of Classification Search
CPC .. B32B 1/02; B32B 7/12; B32B 17/06; B32B 17/10; G06F 1/16; G06F 1/1613;
(Continued)

(56) References Cited

U.S. PATENT DOCUMENTS

| 2015/0274585 A1* | 10/2015 | Rogers | ................. C03C 21/002 |
| | | | 361/679.26 |
| 2016/0286671 A1 | 9/2016 | Zahoor et al. | |
| 2017/0013731 A1* | 1/2017 | Lee | ........................ G06F 1/1637 |

FOREIGN PATENT DOCUMENTS

| EP | 2709283 | 3/2014 |
| EP | 3116204 | 1/2017 |

(Continued)

OTHER PUBLICATIONS

PCT International Preliminary Report on Patentability in International Appln. No. PCT/US2018/065617, dated Jun. 25, 2020.

(Continued)

*Primary Examiner* — Walter Aughenbaugh
(74) *Attorney, Agent, or Firm* — Fish & Richardson P.C.

(57) ABSTRACT

A mobile communication device includes a frame; a three-dimensional cover glass that includes a perimeter portion and an interior portion, the perimeter portion including a bended portion that extends under at least a portion of the frame; a housing positioned adjacent the frame and the cover glass; and a patch member positioned in a gap between the bended portion of the cover glass and the housing.

29 Claims, 7 Drawing Sheets

(51) Int. Cl.
  *H04M 1/02* (2006.01)
  *H05K 5/00* (2006.01)
  *B32B 7/12* (2006.01)
  *B32B 17/06* (2006.01)
  *H04M 1/18* (2006.01)
(52) U.S. Cl.
  CPC .......... *G06F 1/1656* (2013.01); *H04M 1/026* (2013.01); *H04M 1/0249* (2013.01); *H04M 1/185* (2013.01); *H05K 5/0004* (2013.01)
(58) Field of Classification Search
  CPC .... G06F 1/1633; G06F 1/1637; G06F 1/1656; G06F 1/1658; H04M 1/026; H04M 1/0266; H04M 1/0202; H04M 1/0249; H04M 1/03; H04M 1/18; H04M 1/185; H05K 5/0004; H05K 5/0017
  See application file for complete search history.

(56) References Cited

FOREIGN PATENT DOCUMENTS

| | | |
|---|---|---|
| KR | 10-2016-0097105 | 8/2016 |
| KR | 10-2017-0005755 | 1/2017 |

OTHER PUBLICATIONS

PCT International Search Report and Written Opinion in International Appln. No. PCT/US2018/065617, dated Jun. 20, 2019, 10 pages.

Sugru.com [online], "How to make protective phone bumpers," May 2016, retrieved on May 25, 2021, retrieved from URL<https://sugru.com/projects-inspiration/tech-gadget/how-to-make-protective-phone-bumpers>, 9 pages.

WindowCentral.com [online], "Everything you need to know about Corning Gorilla Glass," May 2016, retrieved on May 25, 2021, retrieved from URL<https://www.windowscentral.com/corning-gorilla-glass-explained>, 13 pages.

Office Action in Korean Appln. No. 10-2020-7020212, dated Mar. 28, 2022, 16 pages (with English translation).

* cited by examiner

US 11,480,999 B2

MOBILE COMMUNICATION DEVICE COVER GLASS

CROSS-REFERENCE TO RELATED APPLICATION

This application is a National Stage Application under 35 U.S.C. § 371 and claims the benefit of International Application No. PCT/US2018/065617, filed on Dec. 14, 2018, which claims priority to U.S. Provisional Application Ser. No. 62/599,532, filed on Dec. 15, 2017. The disclosure of the prior applications are considered part of and are incorporated by reference in the disclosure of this application.

TECHNICAL FIELD

This disclosure generally relates to a mobile communication device cover and, more particularly, a mobile communication device cover glass.

BACKGROUND

Mobile communication devices, such as smartphones, often use a three-dimensional cover glass as one component of many in the overall structure of the device. In some instances of mobile communication devices, the cover glass has rounded edges and corners to effect the three-dimensional shape. Often, manufacturers of mobile communication devices use relatively thin cover glass to reduce an overall thickness of the device.

SUMMARY

Implementations of the present disclosure are generally directed to example implementations of a mobile communication device that includes a three-dimensional cover glass and at least one patch member positioned adjacent a bended or planar portion of the cover glass to, for example, prevent or help prevent damage to the cover glass (e.g., cracking, shattering, splitting, or otherwise) upon impact onto the cover glass by an object (e.g., a floor or other object).

In an example implementation, a mobile communication device includes a frame; a three-dimensional cover glass that includes a perimeter portion and an interior portion, the perimeter portion including a bended portion that extends under at least a portion of the frame; a housing positioned adjacent the frame and the cover glass; and a patch member positioned in a gap between the bended portion of the cover glass and the housing.

In an aspect combinable with the example implementation, the patch member is bonded to the cover glass.

In another aspect combinable with any of the previous aspects, the patch member is positioned in the gap at a corner of the bended portion of the cover glass.

In another aspect combinable with any of the previous aspects, the patch member includes a first patch member.

Another aspect combinable with any of the previous aspects further includes a second patch member positioned in the gap between the bended portion of the cover glass and the housing.

In another aspect combinable with any of the previous aspects, the first patch member is positioned in the gap at a first corner of the bended portion of the cover glass, and the second patch member is positioned at a second corner of the bended portion of the cover glass.

In another aspect combinable with any of the previous aspects, the patch member includes a material having a Young's modulus between 10 MPa and 100,000 MPa.

In another aspect combinable with any of the previous aspects, the Young's modulus is greater than 1,000 MPa.

In another aspect combinable with any of the previous aspects, the patch member includes a material comprised of at least one of ABS plastic, nylon, epoxy, or glass.

In another aspect combinable with any of the previous aspects, the patch member and the cover glass are comprised of glass.

In another aspect combinable with any of the previous aspects, the patch member and the cover glass are integrally formed.

In another aspect combinable with any of the previous aspects, a thickness of the cover glass at the integral formation with the patch member is thicker than a thickness of the cover glass at the middle portion.

In another aspect combinable with any of the previous aspects, a thickness of the patch member is 1 mm.

In another aspect combinable with any of the previous aspects, a portion of the housing is in contact with a portion of the patch member, and a portion of the cover glass is in contact with another portion of the patch member.

In another aspect combinable with any of the previous aspects, the cover glass is a front or top cover glass.

In another example implementation, a method for forming at least a portion of a mobile communication device includes positioning a three-dimensional cover glass within a frame, the cover glass including a perimeter portion and an interior portion, the perimeter portion including a bended portion; positioning a housing adjacent the cover glass and the frame; and positioning a patch member in a gap between the bended portion of the cover glass and the housing.

An aspect combinable with the example implementation further includes bonding the patch member to the cover glass.

In another aspect combinable with any of the previous aspects, the patch member is positioned in the gap at a corner of the bended portion of the cover glass.

In another aspect combinable with any of the previous aspects, the patch member includes a first patch member.

Another aspect combinable with any of the previous aspect further includes positioning a second patch member in the gap between the bended portion of the cover glass and the housing.

In another aspect combinable with any of the previous aspects, the first patch member is positioned in the gap at a first corner of the bended portion of the cover glass, and the second patch member is positioned at a second corner of the bended portion of the cover glass.

In another aspect combinable with any of the previous aspects, the patch member includes a material having a Young's modulus between 10 MPa and 100,000 MPa.

In another aspect combinable with any of the previous aspects, the Young's modulus is greater than 1,000 MPa.

In another aspect combinable with any of the previous aspects, the patch member includes a material comprised of at least one of ABS plastic, nylon, epoxy, or glass.

Another aspect combinable with any of the previous aspects further includes forming the patch member and the cover glass of glass.

In another aspect combinable with any of the previous aspects, the patch member and the cover glass are integrally formed.

In another aspect combinable with any of the previous aspects, a thickness of the cover glass at the integral formation with the patch member is thicker than a thickness of the cover glass at the middle portion.

In another aspect combinable with any of the previous aspects, a thickness of the patch member is 1 mm.

In another aspect combinable with any of the previous aspects, a portion of the housing is in contact with a portion of the patch member, and a portion of the cover glass is in contact with another portion of the patch member.

Another aspect combinable with any of the previous aspects further includes: bonding the patch member to the cover glass; subsequent to the bonding, forming the bended portion of the cover glass.

In another aspect combinable with any of the previous aspects, the cover glass is a front or top cover glass.

Implementations according to the present disclosure may include one, some, or all of the following features. For example, implementations of a mobile communication device cover glass according to the present disclosure may decrease or prevent (at least partially) a cover glass from breaking, shattering, or cracking at particular portions of the cover glass that are most susceptible to such problems, for example, when the device is dropped or otherwise impacted. As another example, implementations of a mobile communication device cover glass according to the present disclosure may decrease or prevent (at least partially) a cover glass from breaking, shattering, or cracking at one or more corners of a three-dimensional cover glass. As another aspects, implementations of a patch member may be applied to one or both of a front cover glass or a back cover glass.

The details of one or more implementations of the present disclosure are set forth in the accompanying drawings and the description below. Other features and advantages of the present disclosure will be apparent from the description and drawings, and from the claims.

DETAILED DESCRIPTION

This disclosure describes example implementations of a mobile communication device that includes a three-dimensional cover glass ("cover glass") and at least one patch member positioned adjacent a bended or planar portion of the cover glass to, for example, prevent or help prevent damage to the cover glass (e.g., cracking, shattering, splitting, or otherwise) upon impact onto the cover glass by an object (e.g., a floor or other object).

Figure 1:
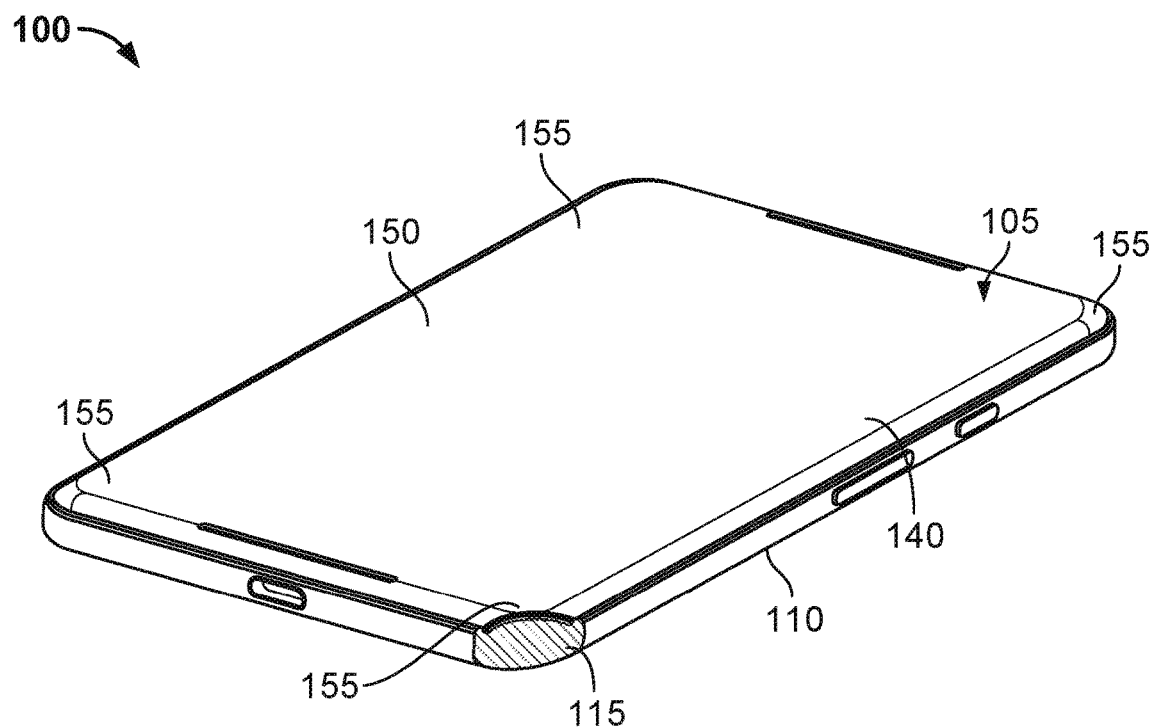
FIG. 1 illustrates an example implementation of a mobile communication device that includes a three-dimensional cover glass.

FIG. 1 illustrates an example implementation of a mobile communication device 100 that includes a three-dimensional cover glass 105. In this example implementation, the mobile communication device 100 may be, for example, a smartphone, tablet device, laptop computer, or other mobile computing device that includes communication capabilities, such as, for instance, cellular communication, Wi-Fi communication, Bluetooth communication, or otherwise. Thus, while certain components of the mobile communication device 100 are shown and described in the present disclosure, other components (such as processors, memory modules, communication antennas, and other components) are not specifically described but would be known.

In alternative implementations, reference numeral 100 may represent a mobile computing device that does not have communication capabilities (e.g., no cellular, Wi-Fi, Bluetooth capabilities). Thus, generally, the reference numeral 100 represents a computing device that includes a cover glass, such as cover glass 105 through which, for example, information and data may be displayed, selected, activated, or otherwise manipulated (e.g., through touch or haptic contact) by a human user.

As shown in this example implementation, the mobile communication device 100 includes the cover glass 105 that is positioned in the device adjacent a frame 110. In some aspects, the cover glass 105 represents a "top" or "front" face of the device 100, and includes a perimeter portion 140 that surrounds an interior portion 150 of the cover glass 105. In alternative aspects, however, the cover glass 105 may represent a "bottom" or "back" face of the device 100.

In this example, the mobile communication device 100 is generally rectangular in shape, with four corners 155 of the cover glass 105 (with the corners 155 being part of the perimeter portion 140). Other example implementations of the mobile communication device 100 may be generally square in shape (e.g., also with four corners 155) or may be another shape (e.g., with less than or more than four corners 155). In some aspects, a thickness of the cover glass 105 may be, e.g., about 0.5 mm to about 0.7 mm.

Figure 2A:
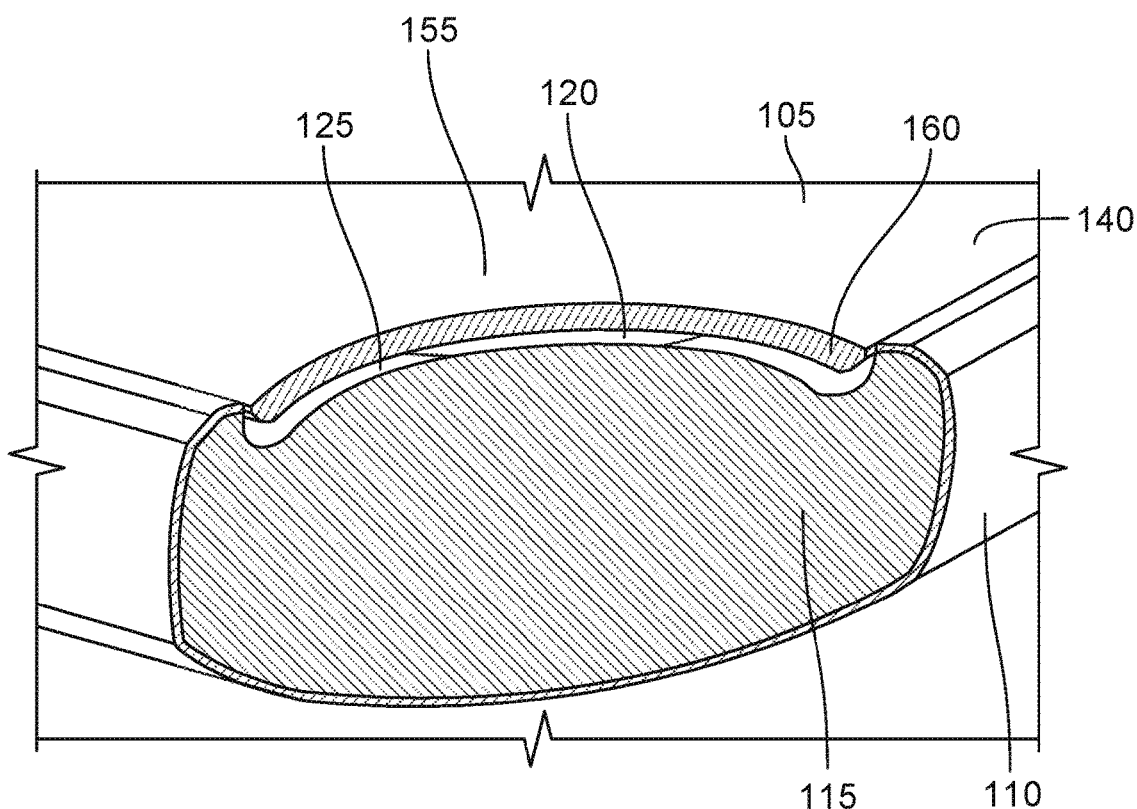
FIG. 2A illustrates a portion of the mobile communication device of FIG. 1 that includes a patch member.

FIG. 1 shows a cutaway view at one of the corners 155, which shows a portion of a housing 115 of the mobile communication device 100. FIG. 2A illustrates the cutaway portion of the mobile communication device 100 of FIG. 1 and further shows a patch member 120 positioned between the cover glass 105 and the housing 115. In this example, the patch member 120 is positioned at the corner 155 of the perimeter portion 140 of the cover glass 105. In some aspects, for example, the mobile communication device 100 may include a patch member 120 positioned at each corner 155 of the perimeter portion 140 of the cover glass 105 (e.g., at each of four corners or any number of corners). In some aspects, the mobile communication device 100 may include a patch member 120 positioned at one or more corners 155 of the perimeter portion 140 of the cover glass 105 (e.g., at one or more of four corners or any number of corners).

In some aspects, the patch member 120 may be generally circular or elliptical in shape, with a diameter of about 5 mm and a thickness (e.g., at a thickest location) of about 1 mm. In some aspects, for example, the patch member 120 may be generally hemispherical or semi-spherical in shape. Also, the patch material 120 may be formed from a variety of materials, such as, for example, nylon, epoxy, ABS plastic, glass, or other material.

In some cases, the cover glass 105 and the patch member 120 may be formed from the same material, e.g., a glass material. For instance, during manufacture, the cover glass 105 may be integrally formed with the patch member 120 such that the glass of the cover glass 105 and the glass of the patch member 120 cure simultaneously or substantially simultaneously. In some aspects, such curing may be performed before or subsequent to a bending process that forms a bended portion 160 of the perimeter portion 140 of the cover glass 105. Alternatively, the patch member 120 may be adhesively coupled to one or both of the cover glass 105 or the housing 115 (or the frame 110). Alternatively, the patch member 120 may be independent of one or both of the cover glass 105 or the housing 115 (or the frame 110), e.g., in contact with but not adhesively or otherwise coupled to another component.

In some aspects, the patch member 120 may be formed from a material having particular mechanical properties, such as a particular Young's modulus. For instance, in some aspects, the patch member 120 may be formed from a material having a Young's modulus between about 6 MPa and about 100,000 MPa.

Figure 2B:
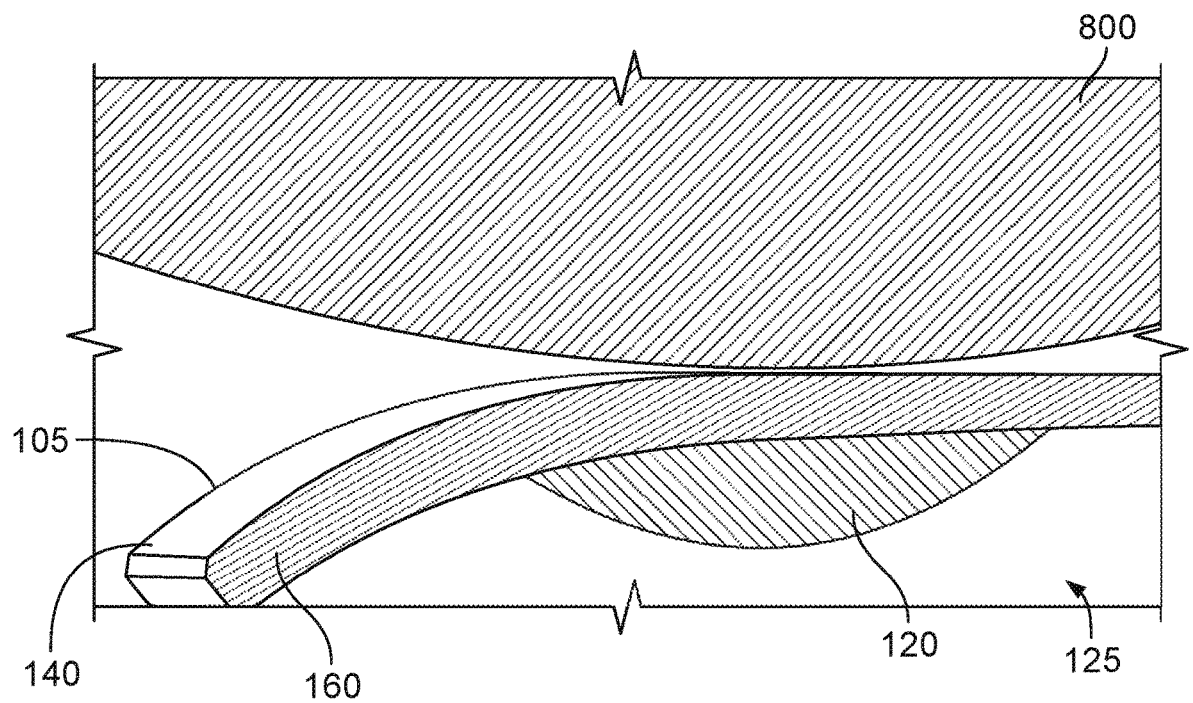
FIG. 2B illustrates an example implementation of the mobile communication device of FIG. 2A.

As shown in FIG. 2A, in this implementation, the patch member 120 is positioned within an air gap 125 between the cover glass 105 and the housing 115. In some aspects, some or most of the patch member 120 has no or little contact with the housing 115 and is, therefore, unsupported by the housing 115 on the side of the patch member 120 opposite the cover glass 105. This implementation is also shown in FIG. 2B. As shown in FIG. 2B, the patch member 120 is positioned in the air gap 125 and in contact with the perimeter portion 140 of the cover glass 105 (near or at the bended portion 150). In this example, the patch member 120 is unsupported by the housing 115, e.g., the patch member 120 is not in contact with or has little contact with the housing 115.

Figure 2C:
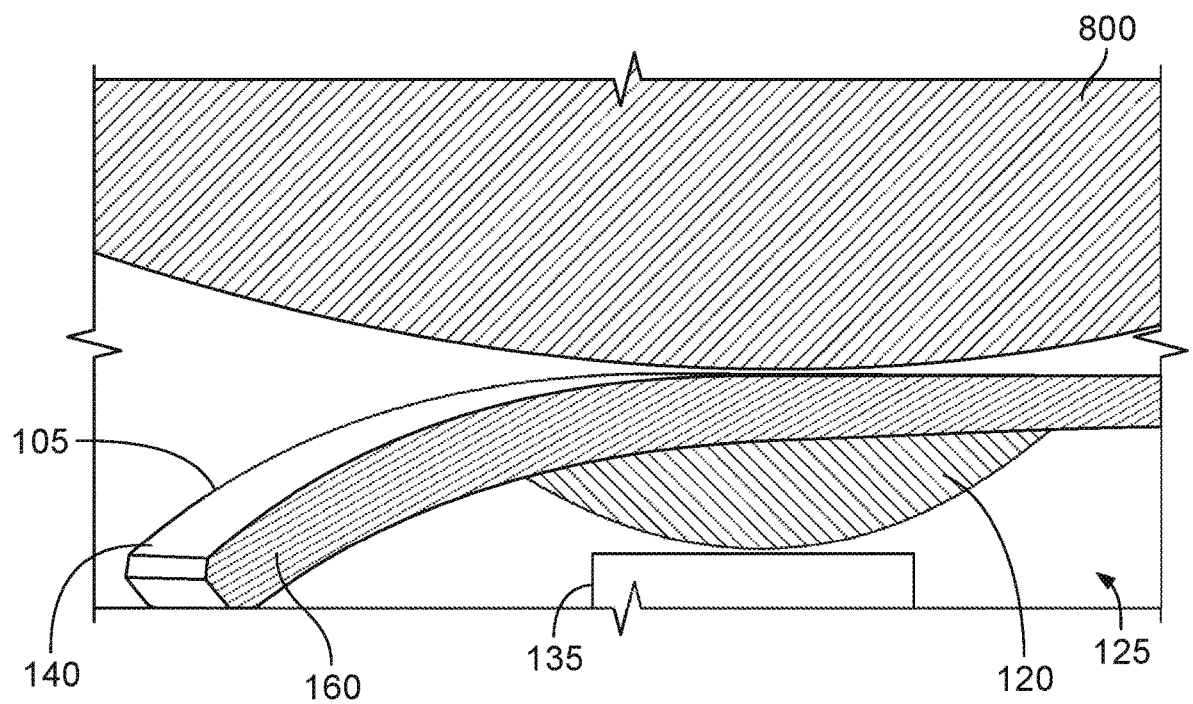
FIG. 2C illustrates another example implementation of the mobile communication device of FIG. 2A.
Figure 3B:
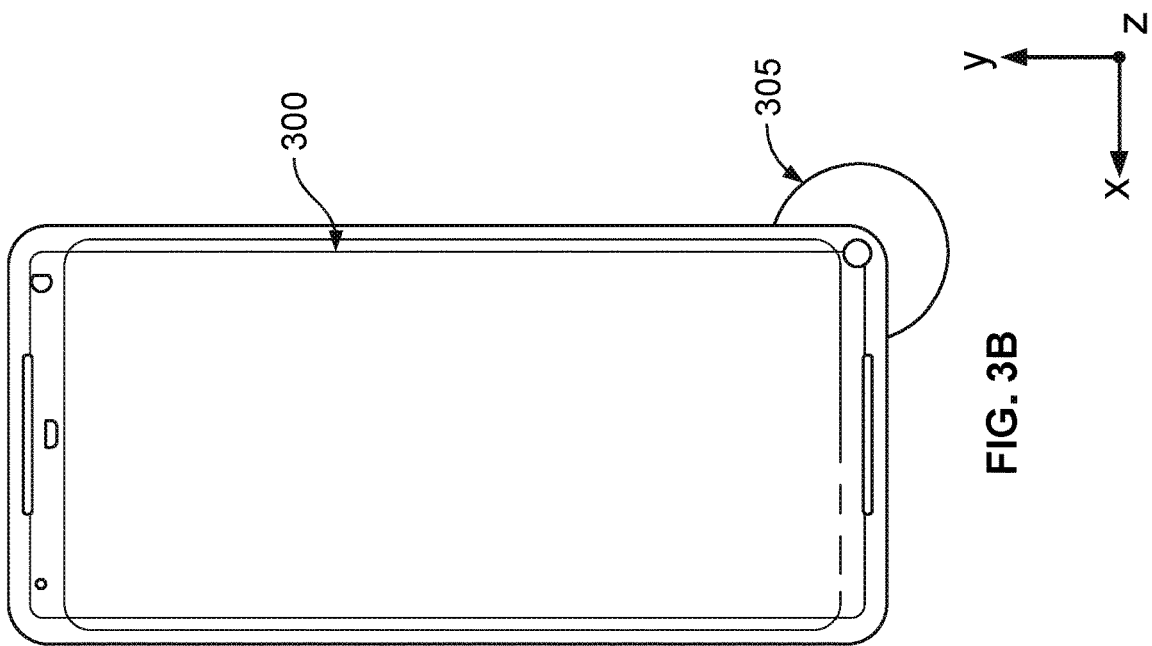
FIGS. 3A-3D illustrate example views of a finite element analysis of a drop ball test for a three-dimensional cover glass of a mobile communication device.
Figure 3A:
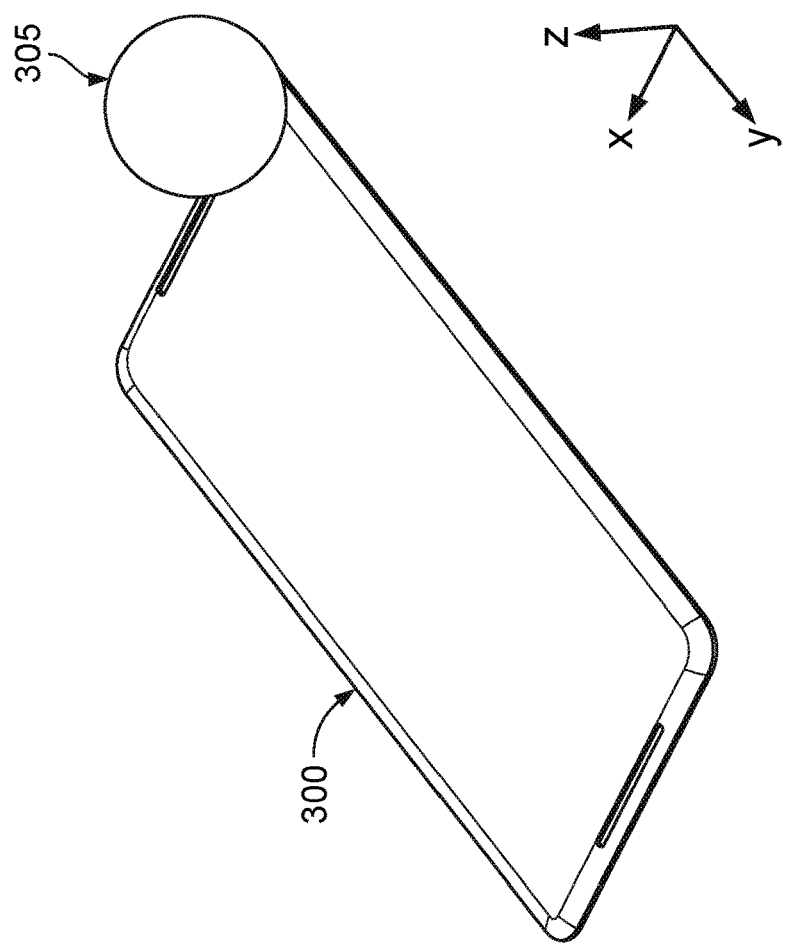
Figure 3C:
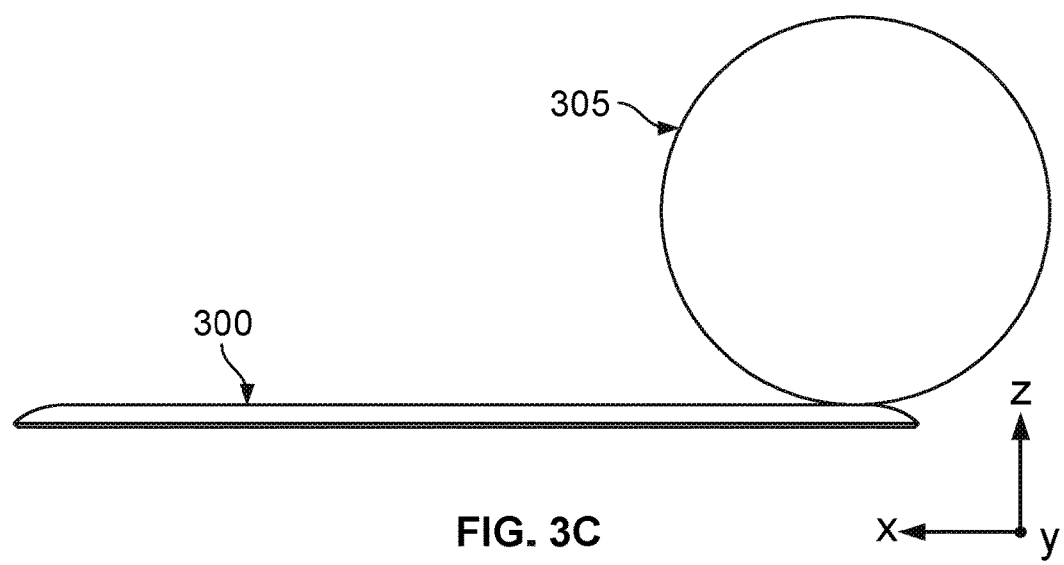
Figure 3D:
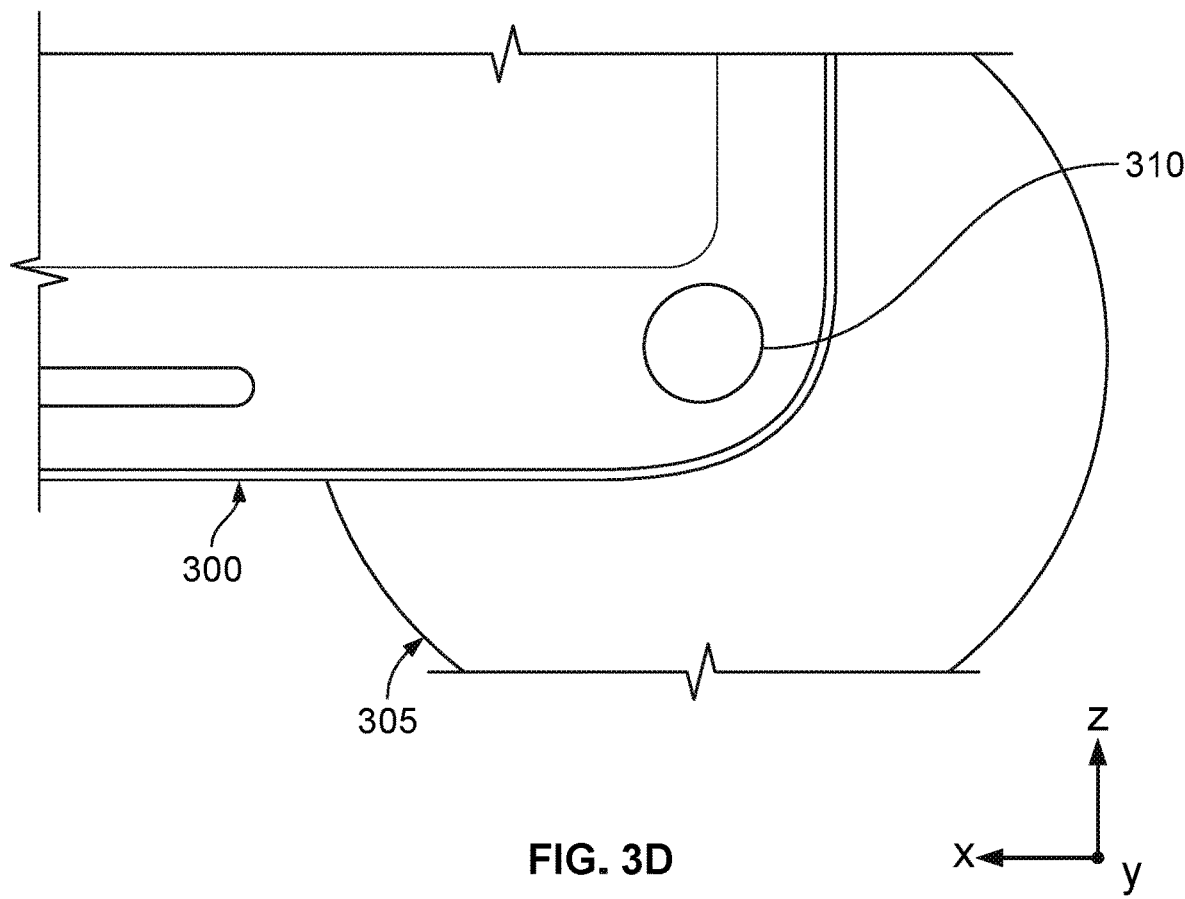

FIG. 2C illustrates another example implementation of the mobile communication device 100 in which the patch member 120 is supported (e.g., totally or mostly) by the housing 115. For example, as shown in FIG. 2C, the housing 115, e.g., a filler member 135 of the housing 115 may be in contact with the patch member 120. Thus, in this example, the patch member 120 may be in contact on one side with the cover glass 105 and on another side opposite the cover glass 105 with the housing 115. As shown in FIGS. 2B-2C, an object 800 impacting the cover glass 105 may contact the mobile communication device 100 at the location in which the patch member 120 is located (e.g., at a corner 155). In some aspects, the different implementations of the mobile communication device 100 shown in FIGS. 2B-2C may react differently upon such an impact, as described later.

FIGS. 3A-3D illustrate example views of a finite element analysis of a drop ball test for a three-dimensional cover glass of a mobile communication device 300 (which may represent mobile communication device 100). A Finite Element Analysis (FEA) may be used to simulate a steel ball drop test, as shown in FIGS. 3A-3D. This test may be used to evaluate the mobile communication device 300 that includes one or more patch members 120 as described herein. In the example steel ball drop test using FEA, the steel ball 305 is 32 mm in diameter with around 130 gram weight. The cover glass of the representative mobile communication device 300 is 0.5 mm-thick Pixel 2XL 3D glass with a fixed periphery. FIGS. 3A-3D illustrate a location of the impact of the steel ball 305 on the mobile communication device 300 in various views, such as isometric (FIG. 3A), bottom view (FIG. 3B), side view (FIG. 3C), and a zoomed bottom view (FIG. 3D) that shows a patch member 310 and the ball 305 on the cover glass of the mobile communication device 300. In the analysis, an impact location of the ball 305 on the cover glass is at the patch member 310. The analysis was performed with ANSYS R18.0.

Figure 4:
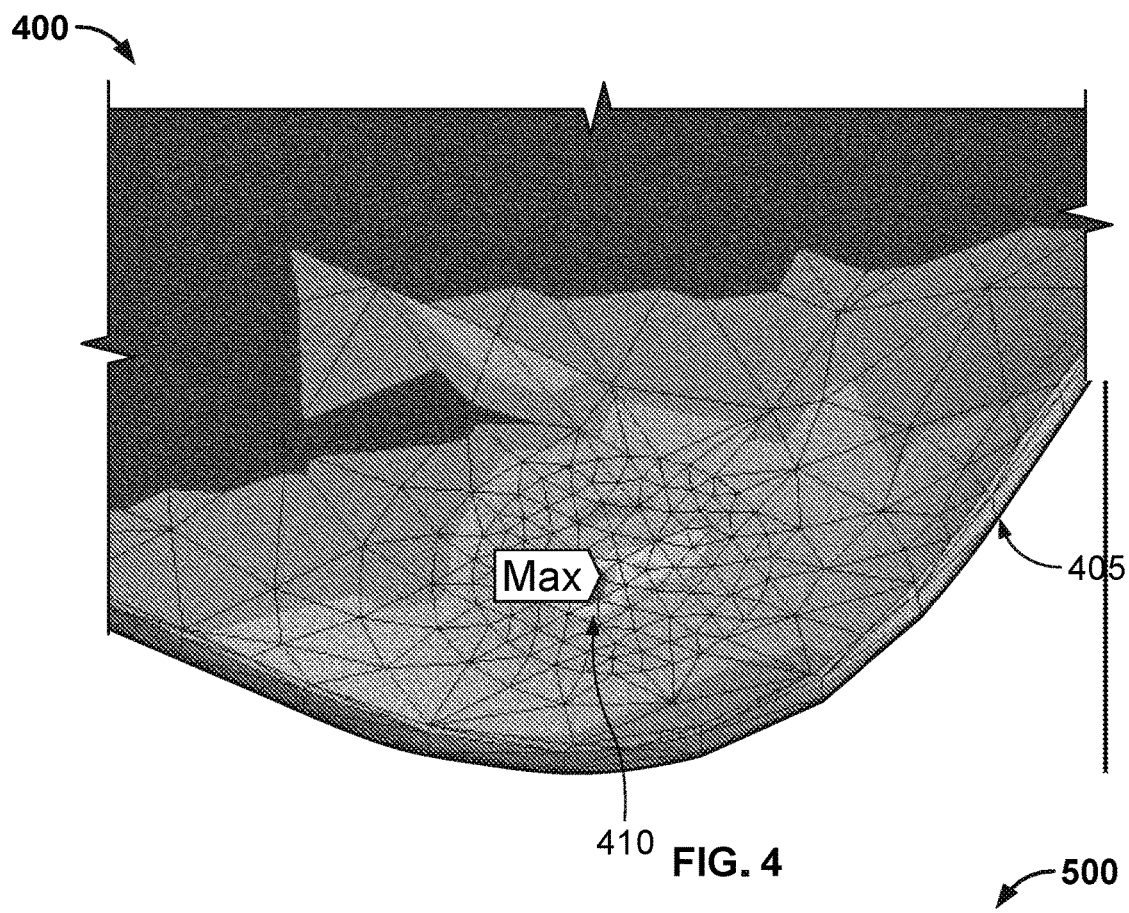
FIG. 4 illustrates a portion of a mobile communication device in the FEA shown in FIGS. 3A-3D.

In this analysis shown in FIGS. 3A-3D, first, a conventional cover glass design without a patch member is simulated with a ball drop height of 5 cm. FIG. 4 shows the cover glass principal (tensile) stress contour plot 400 (steel ball model is hidden) at one specific time (0.3 ms) after ball 305 impact on a cover glass. The ball hit center point 410 at the cover glass inner surface 405 has the largest tensile stress.

Figure 5:
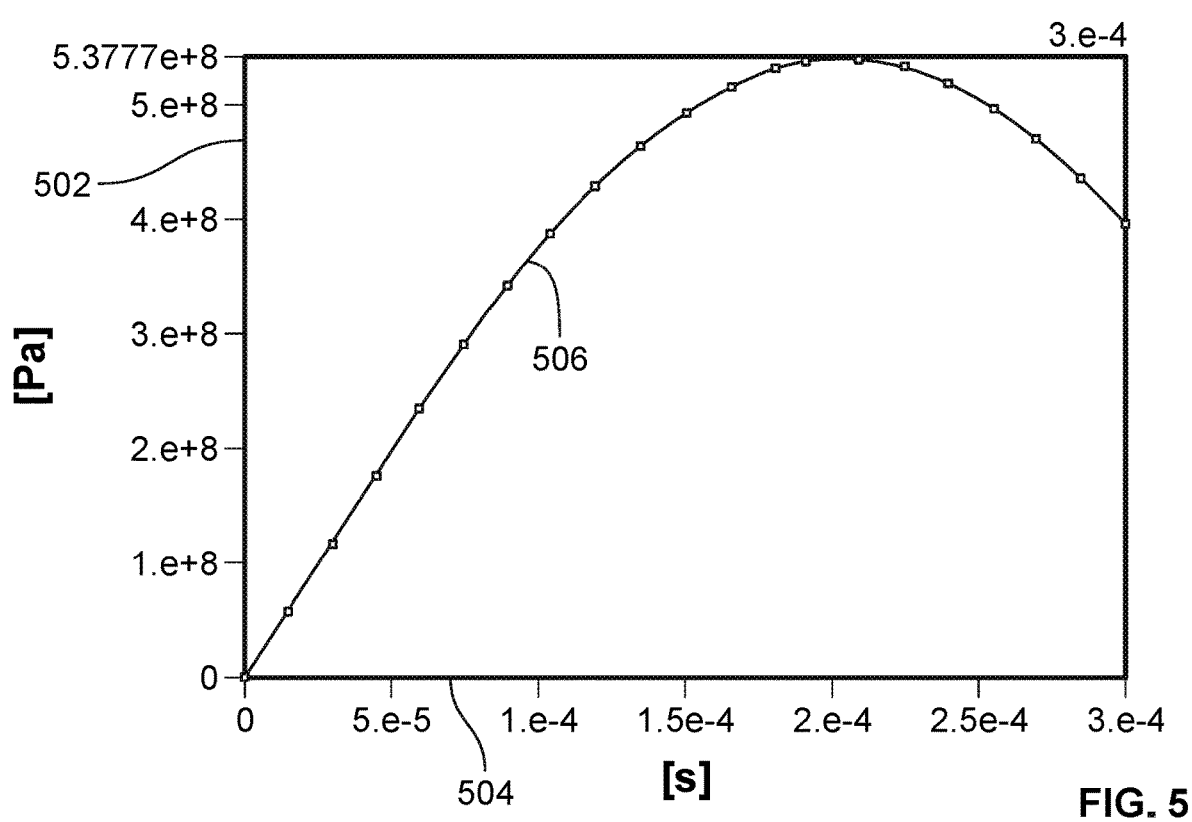
FIG. 5 illustrates a graph showing a maximum principal stress on a three-dimensional cover glass vs. time during the drop ball test shown in FIGS. 3A-3D.

This largest tensile stress over time for the simulated ball drop test of the conventional mobile communication device (without patch member 120) is plotted in FIG. 5. FIG. 5 illustrates a graph 500 that includes a y-axis 502 representing impact stress in Pascals (Pa) and an x-axis 504 representing time in seconds (s). A plot 506 represents the simulated impact stress over time for the ball drop test of the conventional mobile communication device (without patch member). Here, the plot 506 shows that a cover glass maximum tensile stress occurs at 0.2 ms after ball impact with a magnitude of 538 MPa.

Figure 6:
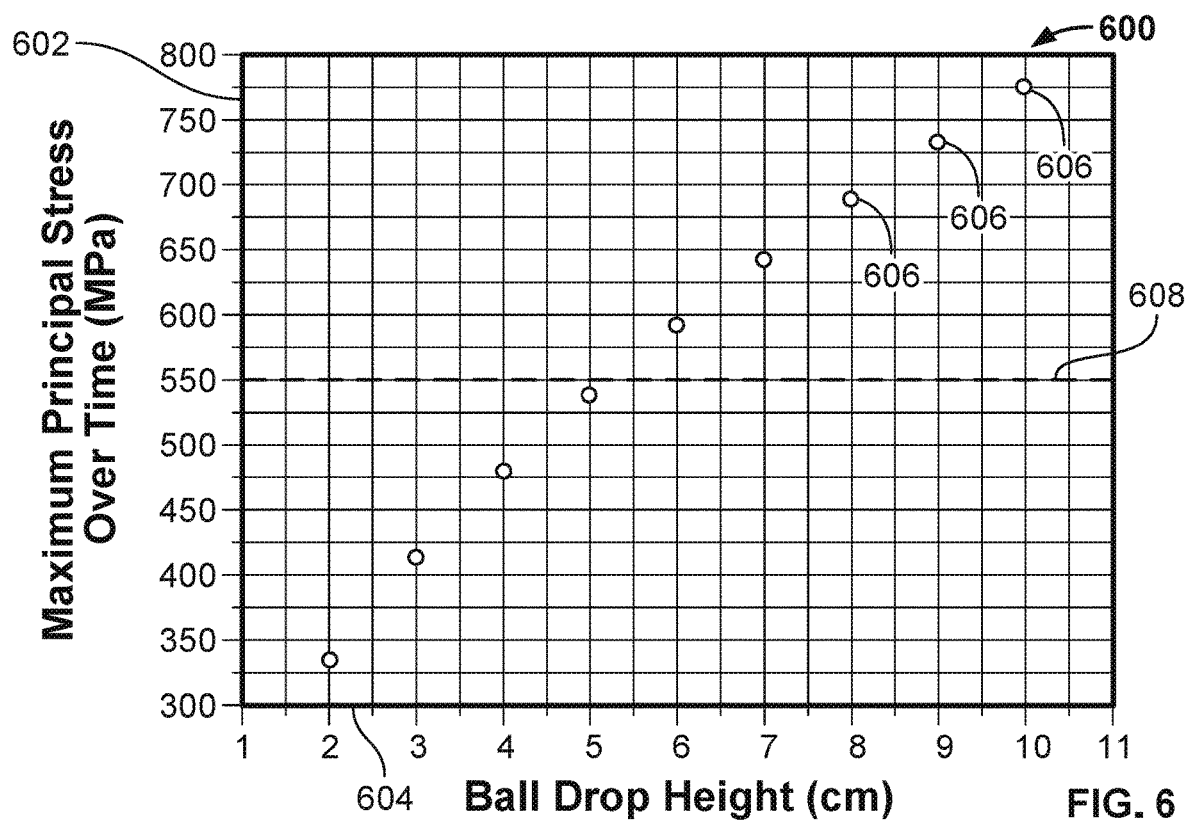
FIG. 6 illustrates a graph showing a maximum principal stress on a three-dimensional cover glass over time vs. ball drop height during the drop ball test shown in FIGS. 3A-3D.

FIG. 6 illustrates another graph 600 that represents results of another simulated ball drop similar to that described with reference to FIGS. 3A-3D and FIG. 5 results. Here, these results represent a similar test as previously described but with various ball drop heights. Thus graph 600 represents a maximum principal stress over time vs. ball drop height of a conventional mobile communication device (without a patch member). As shown, graph 600 includes a y-axis 602 representing maximum principal stress in mega Pascals (MPa) and an x-axis 604 representing ball drop height in centimeters (cm). Plot points 606 represent the maximum principal stresses at specific heights (2 cm through 10 cm, increasing by 1 cm). Graph 600 also shows a "fracture" line 608 that represents a maximum principal stress of 550 MPa, which may represent a stress at which a conventional cover glass (e.g., Gorilla Glass) may crack or fracture due to impact. Thus, as shown, an impact by an object (in this case a steel ball) from more than 5 cm may crack or fracture the cover glass.

Figure 7:
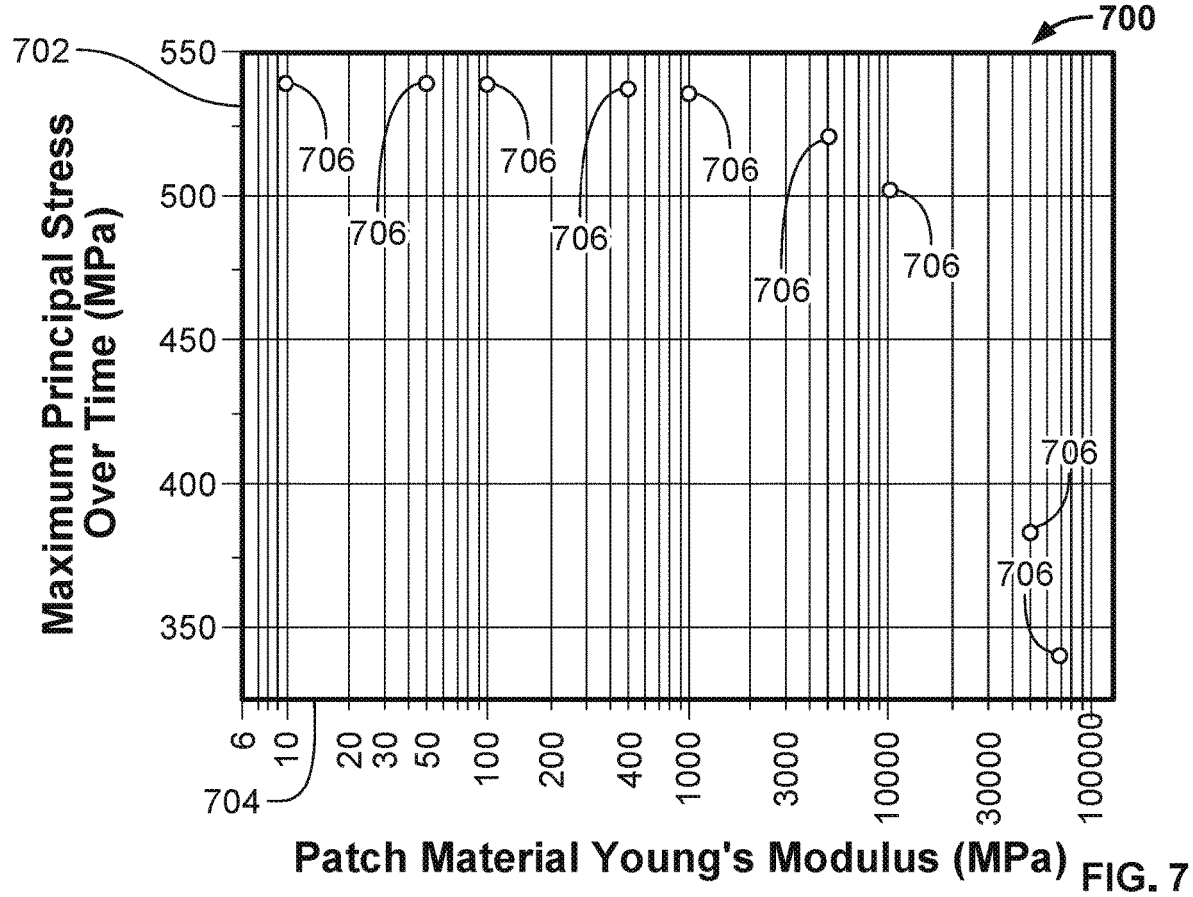
FIG. 7 illustrates a graph showing a maximum principal stress on a three-dimensional cover glass over time vs. patch member material Young's modulus for the drop ball test shown in FIGS. 3A-3D as conducted on the implementation shown in FIG. 2B.

The simulation described above with respect to a conventional mobile communication device (without a patch member) was also performed on a simulated mobile communication device with a patch member, such as the mobile communication device 100 shown in FIG. 2B (a patch member without or with little housing support). FIG. 7 illustrates a graph 700 showing a maximum principal stress on the cover glass 105 of the mobile communication device 100 shown in FIG. 2B vs. patch member material Young's modulus during a 5 cm ball drop height test. As shown, graph 700 includes a y-axis 702 representing maximum principal stress in mega Pascals (MPa) and an x-axis 704 representing Young's modulus in MPa. Plot points 706 represent the maximum principal stresses at specific Young's modulus values (10 MPa to about 70,000 MPa). As illustrated in FIG. 7, when the patch member material is soft with a Young's modulus less than 1,000 MPa, the cover glass maximum principal stress does not change significantly (e.g., remains about 540 MPa). The cover glass maximum principal stress does have significant change when the patch member material Young's modulus is more than 10,000 MPa. Further, the cover glass maximum principal stress can be reduced from 540 MPa to 340 MPa when the patch member material is also glass (e.g., having a Young's modulus of 70,000 MPa).

Figure 8:
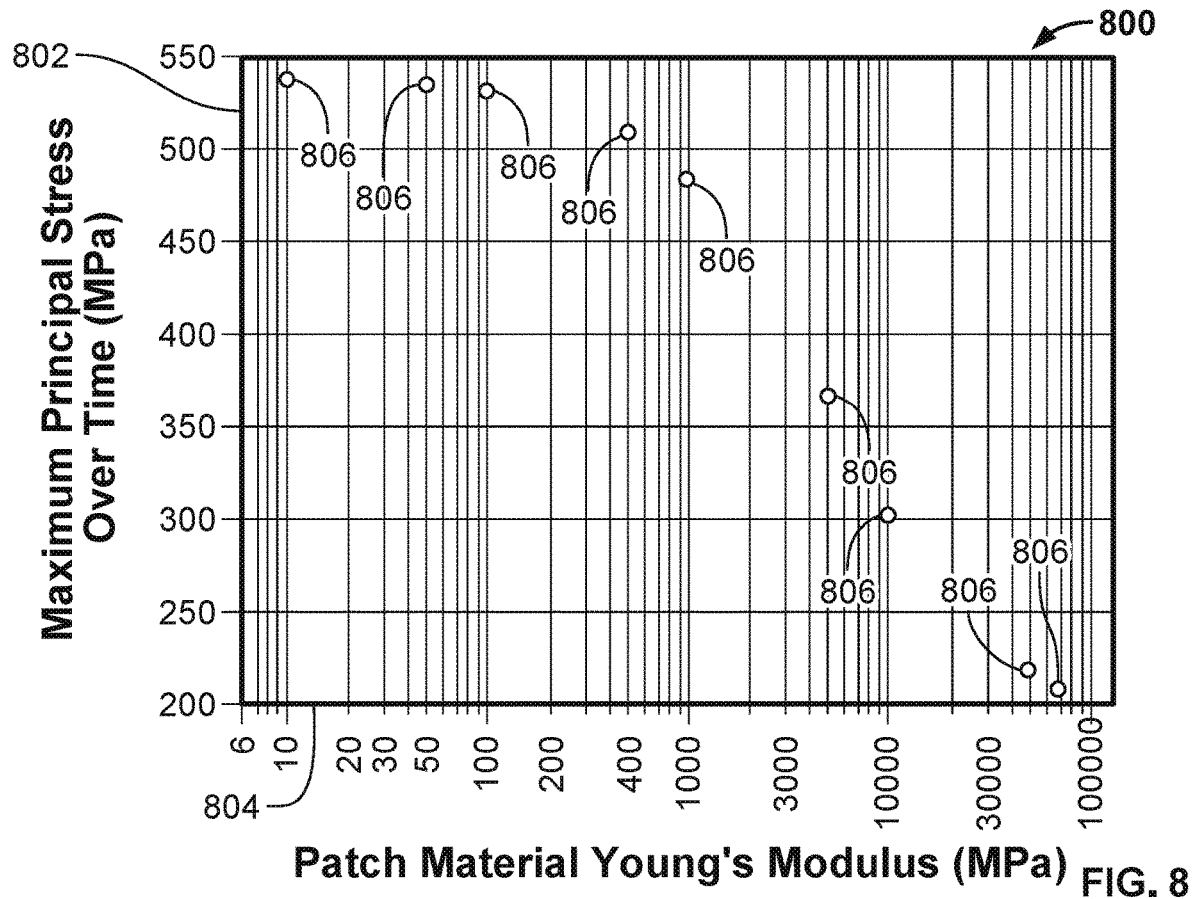
FIG. 8 illustrates a graph showing a maximum principal stress on a three-dimensional cover glass over time vs. patch member material Young's modulus for the drop ball test shown in FIGS. 3A-3D as conducted on the implementation shown in FIG. 2C.

The simulation described above with respect to a conventional mobile communication device (without a patch member) was also performed on a simulated mobile communication device with a patch member, such as the mobile communication device 100 shown in FIG. 2C, that includes housing support. FIG. 8 illustrates a graph 800 showing a maximum principal stress on the cover glass 105 of the mobile communication device 100 shown in FIG. 2C vs. patch member material Young's modulus during a 5 cm ball drop height test. As shown, graph 800 includes a y-axis 802 representing maximum principal stress in mega Pascals (MPa) and an x-axis 804 representing Young's modulus in MPa. Plot points 806 represent the maximum principal stresses at specific Young's modulus values (10 MPa to about 70,000 MPa). As illustrated in FIG. 8, when the patch member material is soft with a Young's modulus less than 1,000 MPa, the cover glass maximum principal stress does not change significantly (e.g., remains about 540 MPa). Further, the cover glass maximum principal stress has significant reduction when the patch member material Young's modulus is more than 1,000 MPa. The cover glass maximum principal stress can be reduced from 540 MPa to 210 MPa when the patch material is also glass (e.g., a Young's modulus of 70,000 MPa). With housing support as shown in the example implementation of FIG. 2C, for example, the patch member material Young's modulus can be an order of magnitude smaller than the implementation shown in FIG. 2B to effectively reduce the cover glass maximum principal stress.

Figure 9:
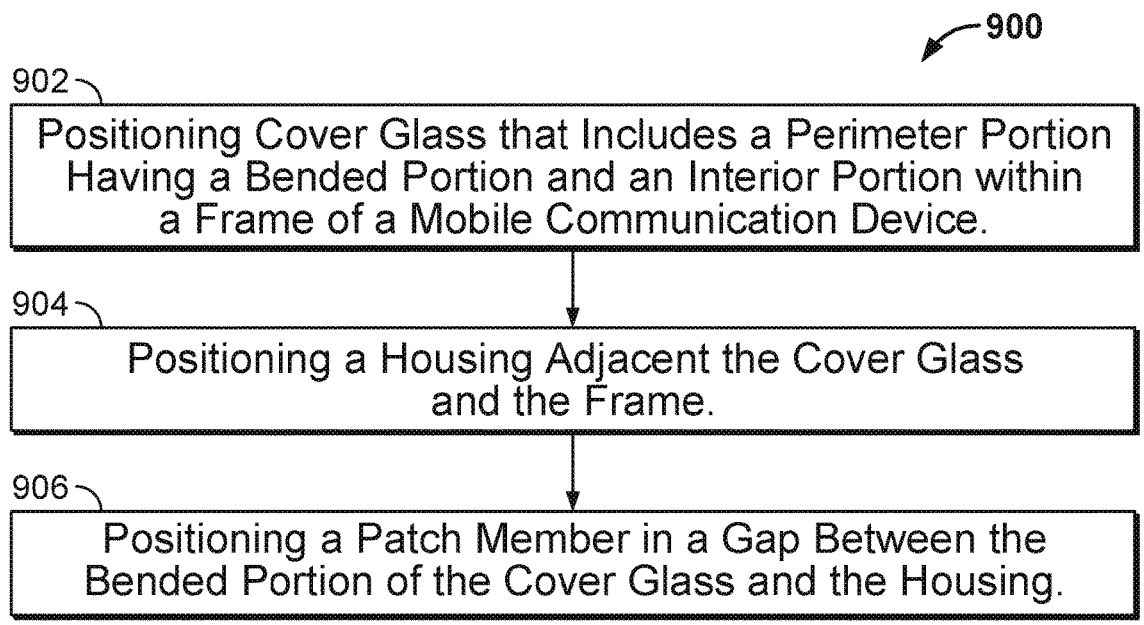
FIG. 9 illustrates a flowchart for an example process for forming at least a portion of a mobile communication device.

FIG. 9 illustrates a flowchart for an example process 900 for forming at least a portion of a mobile communication device. Process 900 may begin at step 902, which includes positioning a cover glass that includes a perimeter portion having a bended portion and interior portion within a frame of a mobile communication device. This is shown, for example, with the mobile communication device 100 in FIGS. 1 and 2A-2C. Process 900 may continue at step 904, which includes positioning a housing adjacent the cover glass and the frame. Process 900 may continue at step 906 which includes positioning a patch member in a gap between the bended portion of the cover glass and the housing. Process 900 may include other aspects and steps as well. For example, steps 904 and 906 may be performed in a different order. In some aspects, the housing may provide contact support to the patch member and in some aspects, the housing may not provide contact support to the patch member. In some aspects, the cover glass and patch member are integrally formed, e.g., from the same or similar material (glass). In some aspects, the patch member is bonded (e.g., adhesively) to one or both of the cover glass or the housing.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A mobile communication device, comprising:
a frame;
a three-dimensional cover glass that comprises a perimeter portion and an interior portion, the perimeter portion comprising a bended portion of the cover glass at which a top surface of the cover glass curves toward a first direction and an opposing bottom surface of the cover glass also curves toward the first direction;
a housing positioned adjacent the frame and the cover glass; and
a patch member positioned partially in a gap between the bended portion of the cover glass and the housing, without the patch member being in contact with or bonded to a side surface of the cover glass or the top surface of the cover glass, wherein the patch member and the cover glass are comprised of glass.

2. The mobile communication device of claim 1, wherein the patch member is bonded to the cover glass.

3. The mobile communication device of either one of claim 1 or 2, wherein the patch member is positioned partially in the gap at a corner of the bended portion of the cover glass.

4. The mobile communication device of claim 1, wherein the patch member comprises a first patch member, the device further comprising a second patch member positioned partially in the gap between the bended portion of the cover glass and the housing.

5. The mobile communication device of claim 4, wherein the first patch member is positioned partially in the gap at a first corner of the bended portion of the cover glass, and the second patch member is positioned partially in the gap at a second corner of the bended portion of the cover glass.

6. The mobile communication device of claim 1, wherein the patch member comprises a material having a Young's modulus between 10 MPa and 100,000 MPa.

7. The mobile communication device of claim 6, wherein the Young's modulus of the patch member is greater than 1,000 MPa.

8. The mobile communication device of claim 1, wherein the patch member and the cover glass are integrally formed.

9. The mobile communication device of claim 8, wherein a thickness of the cover glass at the integral formation with the patch member is thicker than a thickness of the cover glass at the interior portion of the cover glass.

10. The mobile communication device of claim 1, wherein a thickness of the patch member is 1 mm.

11. The mobile communication device of claim 1, wherein a portion of the housing is in contact with a portion of the patch member, and a portion of the cover glass is in contact with another portion of the patch member.

12. The mobile communication device of claim 1, wherein the cover glass comprises a front or top cover glass.

13. The mobile communication device of claim 1, wherein the housing comprises a filler positioned in contact with the patch member.

14. A method for forming at least a portion of a mobile communication device, comprising:
positioning a three-dimensional cover glass within a frame, the cover glass comprising a perimeter portion and an interior portion, the perimeter portion comprising a bended portion of the cover glass at which a top surface of the cover glass curves toward a first direction and an opposing bottom surface of the cover glass also curves toward the first direction;
positioning a housing adjacent the cover glass and the frame; and
positioning a patch member partially in a gap between the bended portion of the cover glass and the housing, without the patch member being in contact with or bonded to a side surface of the cover glass or the top surface of the cover glass, wherein the patch member and the cover glass are comprised of glass.

15. The method of claim 14, further comprising bonding the patch member to the cover glass.

16. The method of either one of claim 14 or 15, wherein the patch member is positioned partially in the gap at a corner of the bended portion of the cover glass.

17. The method of any one of claim 14, wherein the patch member comprises a first patch member, the method further comprising:
positioning a second patch member partially in the gap between the bended portion of the cover glass and the housing.

18. The method of claim 17, wherein the first patch member is positioned partially in the gap at a first corner of the bended portion of the cover glass, and the second patch member is positioned partially in the gap at a second corner of the bended portion of the cover glass.

19. The method of claim 14, wherein the patch member comprises a material having a Young's modulus between 10 MPa and 100,000 MPa.

20. The method of claim 19, wherein the Young's modulus of the patch member is greater than 1,000 MPa.

21. The method of claim 14, wherein the patch member and the cover glass are integrally formed.

22. The method of claim 21, wherein a thickness of the cover glass at the integral formation with the patch member is thicker than a thickness of the cover glass at the interior middle portion of the cover glass.

23. The method of claim 14, wherein a thickness of the patch member is 1 mm.

24. The method of claim 14, wherein a portion of the housing is in contact with a portion of the patch member, and a portion of the cover glass is in contact with another portion of the patch member.

25. The method of claim 14, further comprising:
bonding the patch member to the cover glass; and
subsequent to the bonding, forming the bended portion of the cover glass.

26. The method of claim 14, wherein the cover glass comprises a front or top cover glass.

27. The method of claim 14, further comprising positioning a filler member of the housing in contact with the patch member.

28. The mobile communication device of claim 1, wherein the patch member has a perimeter with a circular shape.

29. The method of claim 14, wherein the patch member has a perimeter with a circular shape.

* * * * *